United States Patent [19]

Tanaka

[11] Patent Number: 5,619,521
[45] Date of Patent: Apr. 8, 1997

[54] SEMICONDUCTOR LASER SYSTEM

[75] Inventor: Haruo Tanaka, Kyoto, Japan

[73] Assignee: Rohm Co., Ltd., Kyoto, Japan

[21] Appl. No.: 574,580

[22] Filed: Dec. 11, 1995

Related U.S. Application Data

[63] Continuation of Ser. No. 208,668, Mar. 11, 1994, abandoned.

[30] Foreign Application Priority Data

Apr. 12, 1993 [JP] Japan ................. 5-84870

[51] Int. Cl.$^6$ ................................ H01S 3/02
[52] U.S. Cl. ............... 372/50; 372/24; 369/44.37; 257/88
[58] Field of Search ................... 372/43, 44, 45, 372/50, 24; 369/44.37, 44.38, 122; 257/88

[56] References Cited

U.S. PATENT DOCUMENTS

| | | | |
|---|---|---|---|
| 4,744,070 | 5/1988 | Takemura et al. | 364/44.38 |
| 4,847,848 | 7/1989 | Inoue et al. | 372/50 |

FOREIGN PATENT DOCUMENTS

| | | | |
|---|---|---|---|
| 0113139 | 9/1980 | Japan | 369/44.37 |
| 63-2121 | 1/1988 | Japan | 369/44.12 |
| 63-292688 | 11/1988 | Japan | 372/50 |
| 3-9588 | 1/1991 | Japan | 372/43 |
| 3-112184 | 5/1991 | Japan | 372/43 |

OTHER PUBLICATIONS

"Full–Wafer Technology —A New Approach to Large–Scale Laser Fabrication and Integration"; Peter Vettiger et al., IEEE Journal of Quantum Electronics, vol. 27, No. 6, Jun. 1991.

"Voltage Change Across the Self–Coupled Semiconductor Laser"; Yoshinobu Mitsuhashi et al., IEEE Journal of Quantum Electronics, vol. QE–17, No. 7, Jul. 1981.

Primary Examiner—Rodney B. Bovernick
Assistant Examiner—Yisun Song
Attorney, Agent, or Firm—Nikaido Marmelstein Murray & Oram LLP

[57] ABSTRACT

A semiconductor laser system for use in an optical pickup is provided which allows the optical pickup to dispense with an expensive optical component such as a beam splitter and to assure accurate tracking sero and focusing servo functions using the SCOOP method, and which includes at least three light-emitting parts formed on one chip and respectively adapted to emit laser beams in a same direction, wherein light-emitting faces of at least two of the light-emitting parts form a step therebetween in the direction in which the laser beams are emitted, and wherein at least two, different in combination from the at least two of the light-emitting parts, of the light-emitting parts are located offset to each other in a direction perpendicular to a plane defined by the direction and the at least two of the light-emitting parts forming the step, while the light-emitting faces of which lie in a plane perpendicular to the direction in which the laser beam are emitted.

4 Claims, 9 Drawing Sheets

41  42  43  44  45

SEMICONDUCTOR LASER SYSTEM

This application is a continuation division of application Ser. No. 08/208,668, filed Mar. 11, 1994 now abandoned.

FIELD OF THE INVENTION

The present invention relates to semiconductor laser systems for use in optical pickups and, more particularly, to a semiconductor laser system for use in a small-size optical pickup capable of correcting tracking errors and focusing errors with good precision.

BACKGROUND OF THE INVENTION

High-density recording is feasible by using a laser for a read/write operation since such an operation is achieved by, in principle, focusing light on a spot having a diameter substantially equal to the wavelength of the laser used. Typically used in the optical recording are an optical disk (hereinafter referred to as "OD") as an information recording medium and an optical pickup using a laser system as means for achieving writing to and reading out of the OD.

Pits provided in the OD for the recording are about 0.9 μm in size each, and lines of pits, namely tracks, are arranged with a narrow pitch of about 1.6 μm. Therefore, in a practical pickup operation pits must be scanned while optical pickup is adjusted to keep on a right track without straying perpendicular to the track direction and on a right focus against irregular revolution of the OD.

A conventional pickup employs an optical element, such as a half mirror or a hologram, as a beam splitter and is adapted to split light reflected from an OD to pick up pits. In this case, a gap from a right track when it strays perpendicular to the track direction in the plane of the OD is corrected by, for example, the 3-beam method in which light from one laser diode (hereinafter referred to as "LD") as a light source is split into three beams by a diffraction grating while a focusing error is detected by, for example, the astigmatism method using a cylindrical lens.

Alternatively, there is developed a SCOOP (Self Coupled Optical Pickup) method as disclosed in, for example, Japanese Unexamined Patent Publication No. 72688/1991, wherein light reflected by an OD is returned to an LD (such light will be referred to as "returning light") and a signal is picked up by utilizing a change in oscillation state of the LD due to returning light. The objective of the SCOOP method is to reduce the number of optical components, such as a beam splitter and a cylindrical lens, as used in the aforesaid conventional pickup, to reduce the cost, and to facilitate precise positioning.

In this SCOOP method are used, for example, five LDs 41 to 45 which are linearly arranged as shown in FIG. 8. The central LD 43 is for RF (Radio Frequency) signals LDs 42 and 44 on both sides of LD 43 are each for tracking error signals, and the outermost LDs 41 and 45 are each for focusing error signals and are slightly shifted in opposite directions along the optical axis. These LDs for error signals detect tracking errors and focusing errors. LDs 42 and 44 for tracking errors are required to detect each of the sides of a signal track and, hence, a semiconductor laser system is configured so that a line of laser beam spots 46 to 50 obliquely crosses the track to detect a tracking error.

The aforesaid semiconductor laser system for use in an optical pickup of the SCOOP type needs to have, besides an LD for recorded signals, LDs for detecting tracking and focusing errors in a fixed positional relation therebetween. Practically, it is very difficult to three-dimensionally dispose separate chips of the order of micron. Therefore, a monolithic and compact semiconductor laser system has so far been desired.

There is another problem to be solved. Since LD 43 for recorded signal and LDs 42 and 44 for tracking error signal are disposed between LDs 41 and 45 for focusing error signal, the LDs 41 and 45 detect signals from portions significantly spaced apart from each other and a focusing error is corrected corresponding to such signals. This results in a problem of inaccurate correction of a focusing error.

The foregoing publication does not disclose the light-receiving part for detecting a variation in laser oscillation state of the reflected light. In case that a plurality of LDs emit light in a narrow region, however, it is required to construct the laser system so that light of each LD can be received by its associated light-receiving element with no mixture of light of another LD. For this reason, an optical waveguide groove must be formed between each LD and its associated light-receiving element, as disclosed in, for example, Japanese Unexamined Utility Model Publication No. 89273/1988. This results in an increased number of components used and hence in a laser system of increased size. Therefore, the problem is caused that the conventional laser systems for use in an optical pickup cannot achieve accurate error detection or reduction in their size.

SUMMARY OF THE INVENTION

It is, therefore, an object of the present invention to overcome the foregoing problems and to provide a less costly semiconductor laser system of reduced size for use in an optical pickup adapted for the SCOOP method and capable of accurately detecting signals recorded in an optical disk.

According to the present invention, there is provided a semiconductor laser system comprising at least three laser beam emitters formed on one semiconductor chip;

the layer beams therefrom are directed in the same direction but do not exist in the same plane, at least two of but not all of the laser beam emitters share one plane perpendicular to the laser beams for their laser beam emitting surfaces.

Preferably, the semiconductor laser system of the present invention further comprises a photodetection part provided in association with each of the at least three light-emitting parts on a side opposite to the light-emitting face thereof, an optical waveguide connecting each photodetection part to the light-emitting part associated therewith, and a light-blocking part formed at least between any two adjacent waveguides.

According to another aspect of the present invention, there is provided a semiconductor laser system for use in an optical pickup, comprising at least three light-emitting Darts for detecting a tracking error signal, a focusing error signal and an RF signal indicative of information recorded in an optical disk, respectively, and a laser diode dedicated to writing information and/or a laser diode dedicated to erasing information, the light-emitting parts and the laser diode being formed on a same chip.

According to yet another aspect of the present invention, there is provided a semiconductor laser system for use in an optical pickup, comprising at least three light-emitting parts for detecting a tracking error signal, a focusing error signal and an RF signal indicative of information recorded in an optical disk, respectively, and a second light-emitting part for detecting another RF signal, the second light-emitting part being spaced apart by a distance equal to a width of a track formed in an optical disk from the light-emitting part for detecting an RF signal in a direction perpendicular to the track.

In the present invention the LDs for detecting the state of a pit, a tracking error signal and a focusing error signal, respectively, are integrated on one chip. Hence, if only the semiconductor laser system is disposed with a predetermined spacing from an objective lens, an optical pickup can be realized which is capable of detecting the state of a pit with precision.

Further, since the light-emitting parts, photodetection parts and the like are monolithically integrated, they can be electrically isolated from each other by implanting hydrogen ion, boron ion or like ion to regions intermediate between adjacent LDs, between adjacent optical waveguides and between adjacent photodetection parts and to other regions, or by mesa isolation or a like isolation technique. In addition, if a suitable light-absorption layer is provided, there can be prevented a erroneous detection due to mutual leakage of light between the components.

Still further, additional diodes for writing, for erasing, and for detecting an RF signal recorded in another track, respectively, are integrated together with the above-mentioned components on one chip, whereby an optical pickup using such a laser system can exhibit high functions such as allowing simultaneous reading and writing and simultaneous reading out of two different tracks.

DETAILED DESCRIPTION

A semiconductor laser system according to the present invention will now be described with reference to the drawings.

Figure 1A:
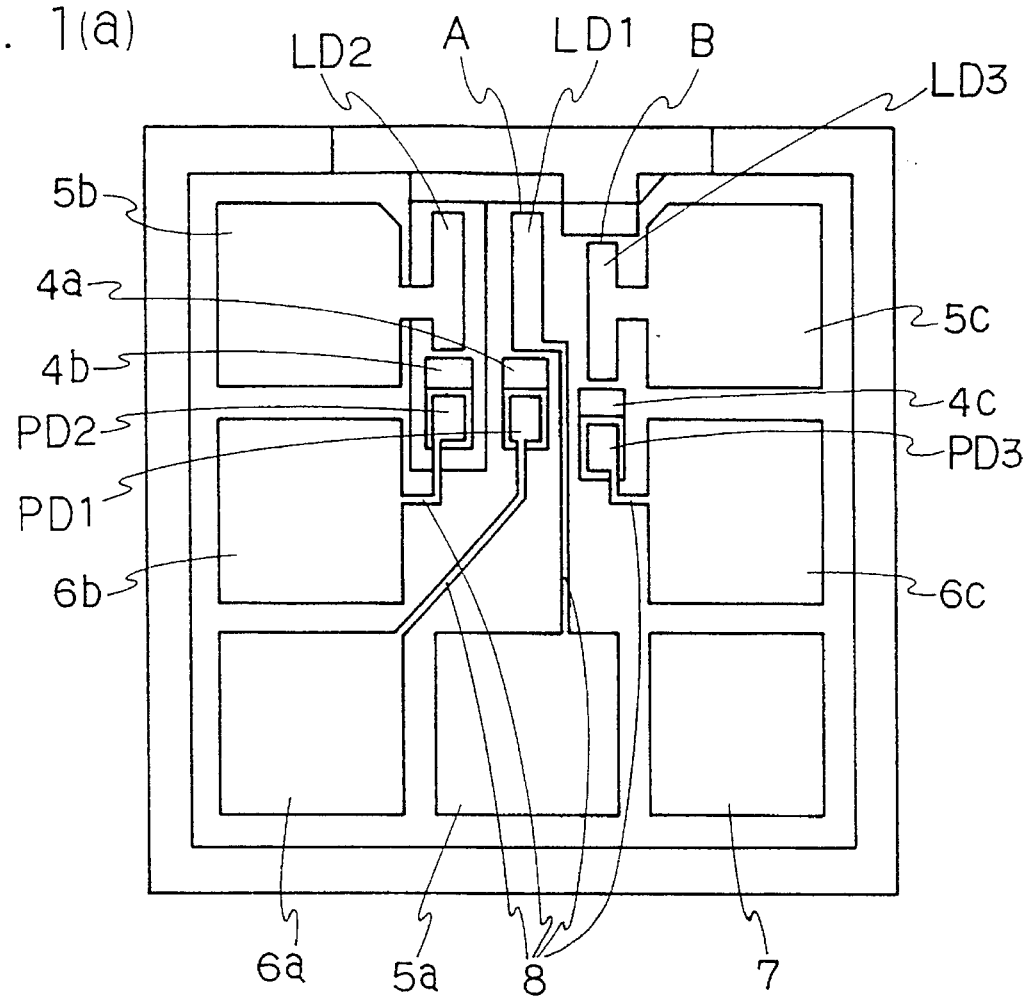
FIGS. 1(a) and 1(b) are a plan view of one embodiment of a semiconductor laser system according to the present invention and an equivalent circuit diagram thereof, respectively.
Figure 1B:
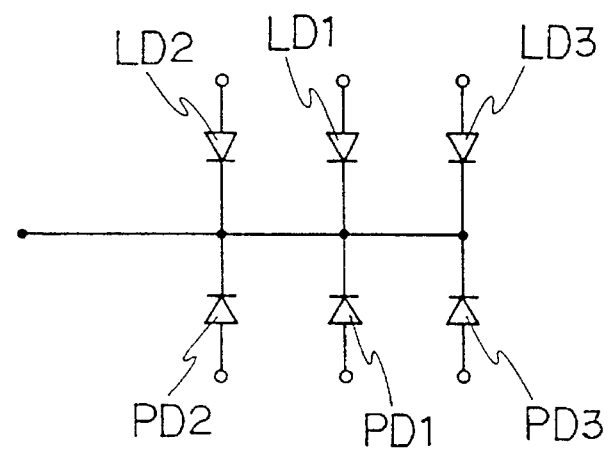

Referring to FIG. 1 showing in plan one embodiment of the semiconductor laser system of the present invention, the system comprises a semiconductor substrate 1 such as made of GaAs, light-emitting parts LD1 to LD3 each formed of an LD having a pn junction in the direction perpendicular to the plane of the figure and adapted to emit laser beam upward in the figure. LD1 is an LD for detecting an RF signal indicative of the state of a pit formed in an OD. As can be seen from FIG. 2, LD1 and LD2 extend to the direction vertical to the light emitting direction and up and down direction in FIG. 2(b) and are adapted to emit laser beams for detection of signals from which a tracking error signal is formed. As shown in FIG. 1, LD3 has a light-emitting face B located lower (in the direction opposite to the light-emitting direction in the figure) than the light-emitting faces A of LD1 and LD2 and is used in cooperation with LD1 for the detection of a focusing error signal. LD3 is disposed in registration with LD1 in height (in the direction vertical to the tracks of the OD).

On the side opposite to the light-emitting faces A and B are disposed photodetection parts PD1 to PD3 with respective waveguides 4a, 4b and 4c intervening between the LDs and the PDs, so that light passing on the side opposite to the light-emitting faces of the LDs can be detected by respective PD. These PDs are formed by utilizing the pn junction defined in the fabrication process for the LDs, while the optical waveguides are formed by forming recesses by etching. Electrode pads 5a, 5b and 5c are connected to respective electrodes of LD1 to LD3, respectively, through wiring 8 to apply voltage to each LD. Similarly, electrode pads 6a, 6b and 6c are connected to PD1 to PD3, respectively. An electrode pad 7 is one for common electrode. The relation between these diodes is shown in the equivalent circuit diagram of FIG. 1(b). Isolation portions 9 serve to electrically isolate adjacent LDs, adjacent waveguides and adjacent PDs from each other which are monolithically integrated. Isolation portions 9 may be formed by implanting boron ion, hydrogen ion or the like or by mesa isolation. The isolation portions 9 which lie between the waveguides may each be provided on its recess side (not on the outer surface of the isolation portion 9 ) with a light-absorption layer such as made of a polyimide resin containing a pigment capable of absorbing laser light, whereby mutual admixture of light between PDs can be prevented. Note that in FIG. 1 each light-emitting part is about 4 μm in width and one side of the chip is for example about 250 μm.

Respective rays of light of LDs can be kept separated if each of the LDs is of the structure having a light-absorption layer in the periphery of its stripe or adapted to confine light transversely of the optical axis. Hence, there can be used in the invention various types of common semiconductor diode chips of such a structure. In forming beam-emitting faces and mirror faces opposite thereto of LDs, however, since the beam-emitting faces are not coplanar with each other, a conventional cleaving method is not suitable therefor. Instead, an anisotropic etching or a like technique is used to form the mirror faces and the like.

Figure 2A:
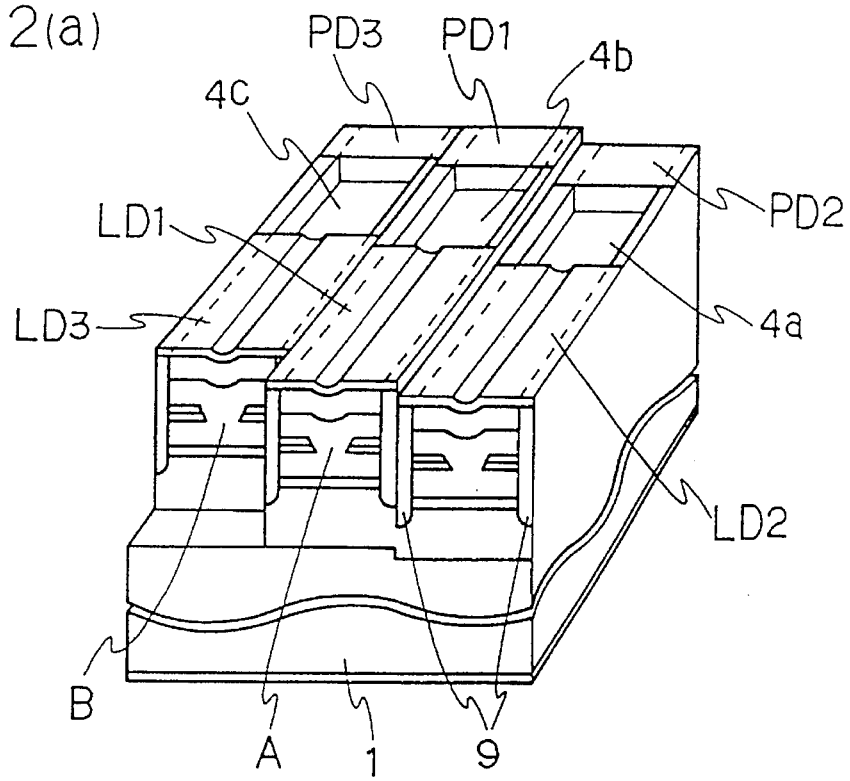
FIGS. 2(a) and 2(b) are a perspective view of the light-emitting part and photodetection part of one embodiment of a semiconductor laser system according to the present invention and a sectional view of the light-emitting part thereof, respectively.
Figure 2B:
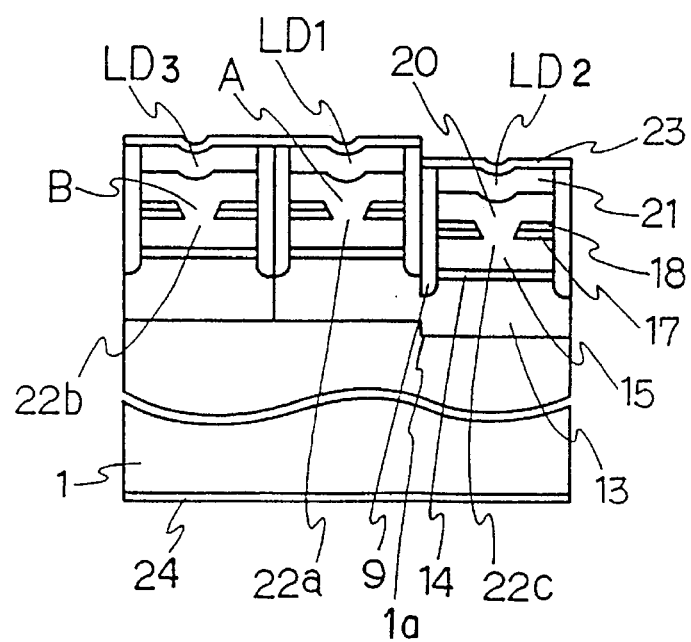

To be described next is an example of the process of fabricating one embodiment of the semiconductor laser system of the present invention, the structure of which is shown in FIGS. 2(a)–2(b). First, a region intended for the provision of LD2 of a semiconductor substrate 1 of n-GaAs is etched, forming a pit 1a therein, to a depth of about 1 to about 60 μm. The substrate 1 is introduced into a growth chamber of an MBE system and heated to 550° C. to 720° C. While heating the substrate 1, deposition is performed to sequentially stack on the substrate 1 a lower clad layer 13 of n-$Al_xGa_{1-x}As$ doped with Si (x=0.3 to 0.8), active layer 14 of $Al_yGa_{1-y}As$ doped with Si (y=0 to 0.25), first upper clad layer 15 of p-$Al_xGa_{1-x}As$ doped with Be (x=0.3 to 0.8), stop layer 17 of n-GaAs, evaporation-preventive layer 18 of $Al_zGa_{1-z}As$ (z=0.1 to 0.25), and oxidation-preventive layer of GaAs (not shown).

The substrate 1 thus formed with the stacked layers is in turn removed from the chamber of MBE system and then the oxidation-preventive layer is covered with a photoresist in regions other than intended for the provision of stripe grooves 22a, 22b and 22c. Using a $H_2SO_4$-based etchant or $H_2O_2$-based etchant the oxidation-preventive layer, evaporation-preventive layer 18 and stop layer 17 are etched to such an extent as to slightly retain the stop layer 17 (for example, to a depth of about 1000 Å) thereby forming stripe grooves 22a, 22b and 22c.

In turn, after removing the photoresist, the substrate 1 is introduced into the growth chamber of the MBE system again, then heated at 710° C. to 790° C. for about 20 minutes while being applied with As molecular beam to evaporate the retained stop layer 17. In this case, because of the difference in evaporation temperature between GaAs and AlGaAs, the stop layer 17 is evaporated, while the first upper clad layer 15 remains not evaporated, so that only the stop layer 17 is selectively evaporated. This results in the first upper clad layer exposed at the bottom of each stripe groove.

The stop layer 17 remaining in regions other than the stripe grooves will serve as a light-absorptive layer which prevents leakage of light between devices.

Subsequently, a second upper clad layer 20 is grown on the substrate 1. The second upper clad layer 20 is made of p-$Al_xGa_{1-x}As$ doped with Be (for example, x=0.3 to 0.8), the carrier concentration of which is set higher by one order of magnitude than that of the first upper clad layer 15. For instance, if the carrier concentration of the first upper clad layer 15 is $3 \times 10^{17}$ cm$^{-3}$, that of the second upper clad layer 20 is set to about $3 \times 10^{18}$ cm$^{-3}$.

When the growth of the second clad layer 20 is completed, the temperature of the substrate 1 is raised again to 700° C. to 760° C., preferably about 730° C. and kept thereat for 5 to 60 minutes to diffuse a dopant in the first upper clad layer 15 through the second upper clad layer 20 at a high concentration thereby forming a current path region.

In turn, a cap layer 21 of p-GaAs is formed on the second upper clad layer 20.

Implantation of proton or boron ion is then performed at an energy of, for example, 20 to 200 keV and a dose of, for example, $10^{11}$ to $10^{14}$ cm$^{-2}$ with respect to regions lying between adjacent prospective LDs and between adjacent prospective PDs thereby electrically isolating the diodes from each other.

Next, to make the light-emitting face of LD3 be retreated, to form PDs for photodetection separately from LDs, and to define an optical waveguide between each pair of LD and PD, masking is performed so as to expose only the end portion of LD3 and regions intended for the waveguides, and then the exposed portions are subjected to anisotropic etching using argon ion, such as chemical assisted ion beam etching performed under chlorine gas atmosphere. Thus, only the light-emitting face of LD3 is made positioned as retreated. In this case using a photoresist film, dielectric film such as made of silicon nitride, metal film or the like as the resist film for this masking makes it possible to mirror-finish the etched surface because the outer periphery of each opening of the mask will not be etched.

Finally, upper and lower electrodes 23 and 24 are formed by vapor-depositing, for example, Au, and then the semiconductor wafer is scribed into chips.

The evaporation-preventive layer 18 and the oxidation-preventive layer are formed after the formation of the stop layer 17 in the above-mentioned example. The evaporation-preventive layer 18 is provided for selective evaporation of GaAs and the oxidation-preventive layer is provided for preventing oxidation of the surface of the semiconductor wafer removed from the chamber and, hence, these preventive layers are not necessarily indispensable for the operation of the lasers. Further, although Si is used as an n-type dopant, another n-type dopant such as Sn or Ge may be used instead of Si. Examples of the p-type dopant for use in the present invention are Zn, Mn or the like as well as Be. Still further, if the conductivity type of each of the layers including the substrate is reversed, there would be obtained a laser system offering the same effects as the laser system constructed herein. The semiconductor substrate as used in this example may be formed of GaP, InP or the like as well as of AlGaAs. In addition, it is needless to say that the present invention may be applied to a laser system using a compound semiconductor such as AlGaInP, AlGaInAs, InGaAsP or AlGaInN, as well as to the AlGaAs-type semiconductor laser system.

To be described next is the method of detecting tracking and focusing errors to read the state of RF signal pits when the semiconductor laser system of the present invention is used in an optical pickup.

In detecting a tracking error with the use of the semiconductor laser system having three LDs as shown in FIG. 1, LD1 and LD2 are used. There are two approaches for detecting a variation in the oscillation state of the light from an LD after reflection; one is a so-called E-SCOOP method which detects a variation in voltage across the terminals of the LD, and the other is a so-called L-SCOOP method which detects light emitted rearwardly from the LD with use of a photodetector such as a PD. Either method is based on the same idea of utilizing an RF component of a signal which is superposed on a DC component thereof. Described hereafter is an example of the L-SCOOP method using a PD as a photodetector.

Figure 3A:
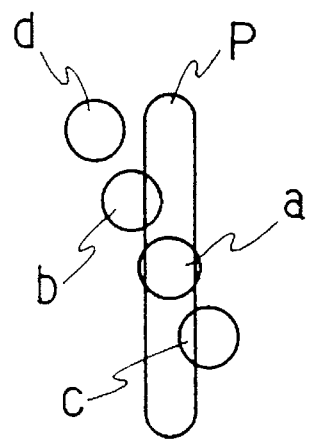
FIG. 3(a) through 3(d) illustrate how the emission state of an LD is varied by returning light.

In forming a spot of light emitted from an LD onto an OD, when the spot is applied just onto a pit P formed on the OD as in the case indicated by a of FIG. 3(a), the reflectivity is small, and the quantity of the reflected light is also small, while when the spot is applied to a region other than the pit P as in the case indicated by d of FIG. 3(a), the reflectivity is large, and the quantity of the reflected light is also large. When the spot partially covers the pit P with the rest thereof on other regions as in the case indicated by b or c of FIG. 3(a), the quantity of returning light varies depending on the area of the beam spot not on the pit P. The more the light is reflected, the denser the light in the cavity of the LD becomes to increase the emission of light therefrom. Therefore, the output of PD monitoring the quantity of light emitted from the LD varies depending on the position of the beam spot as shown in FIGS. 3(b) to 3(d) which show the output of the PD when the center of the beam spot is displaced perpendicular to the track direction.

Figure 3B:
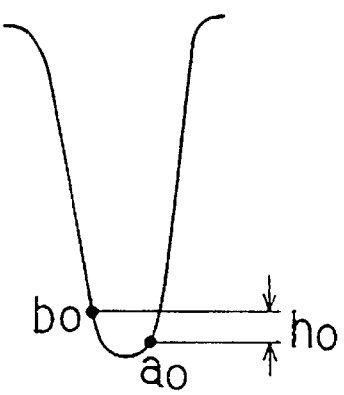
Figure 3C:
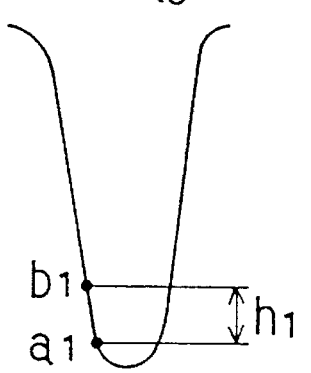
Figure 3D:
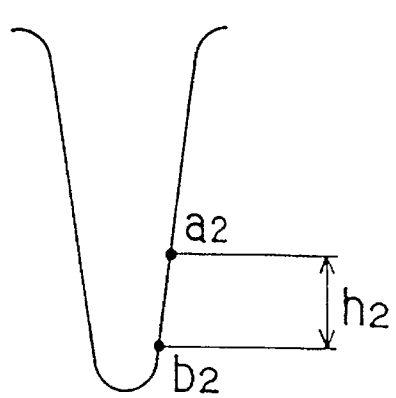

If the respective quantities of light emitted from LD1 and LD2 are detected by PD1 and PD2, respectively, it is found that when the difference $h_o$ between an output $a_o$ of PD1 and an output $b_o$ of PD2 is within a fixed range as shown in FIG. 3(b), the respective spots formed by LD1 and LD2 are in their right positions and, hence, no tracking error is occurring. When, as shown in FIG. 3(c), the difference between respective outputs $a_1$ and $b_1$ of PD1 and PD2, or $a_1-b_1$, is a negative value and its absolute value exceeds the fixed range, the position of respective spot must be corrected rightwardly in FIG. 3(a). Such correction of a tracking error can be achieved by driving a servomotor which is directly connected to the semiconductor laser system. Further, when the difference between respective outputs $a_2$ and $b_2$ of PD1 and PD2, or $a_2-b_2$, is a positive value and exceeds the above-mentioned range as shown in FIG. 3(a), the position of respective spot must be corrected leftwardly by the servomotor.

A focusing error can be corrected by using LD1 and LD3 in a manner similar to the above-mentioned. Specifically, when a beam gets out of focus, the quantity of light returning to the cavity of the LD decreases and, hence, the output of the PD also decreases. Therefore, the direction in which the focusing is to be corrected can be determined depending on whether the difference between the respective outputs of the two PDs associated with LD1 and LD3 is positive or negative, and the correction of such a focusing error can be achieved by a servomotor so that such a difference would be within a predetermined range.

Figure 4:
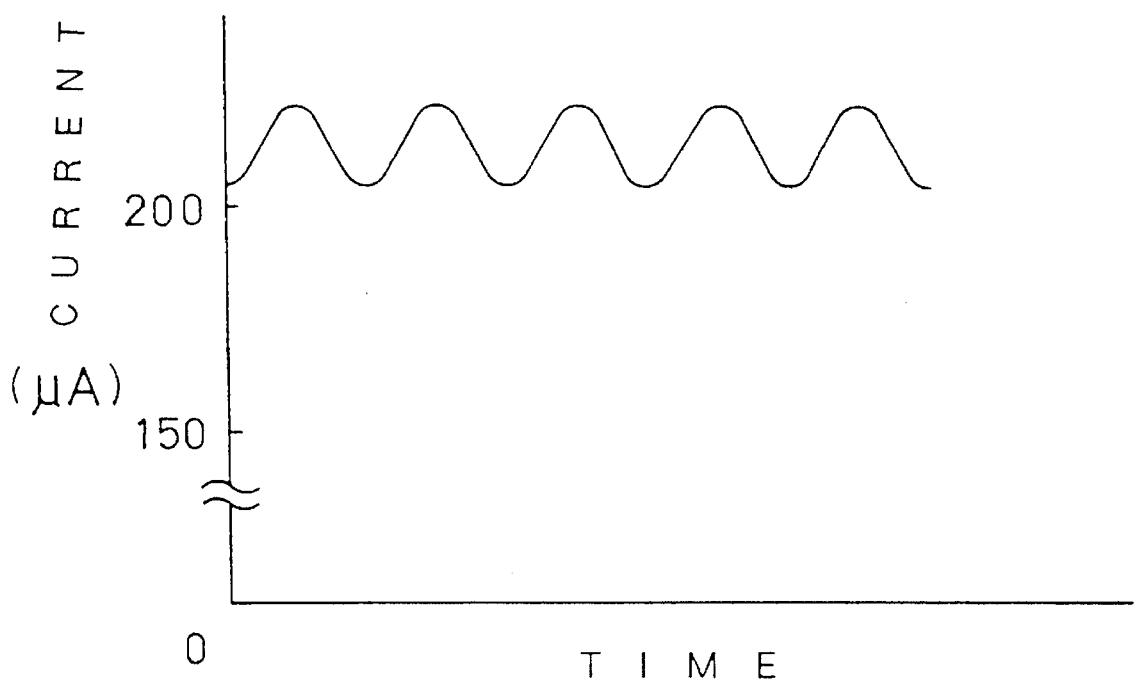
FIG. 4 is a graphic representation of a typical signal detected by a PD.
Figure 5:
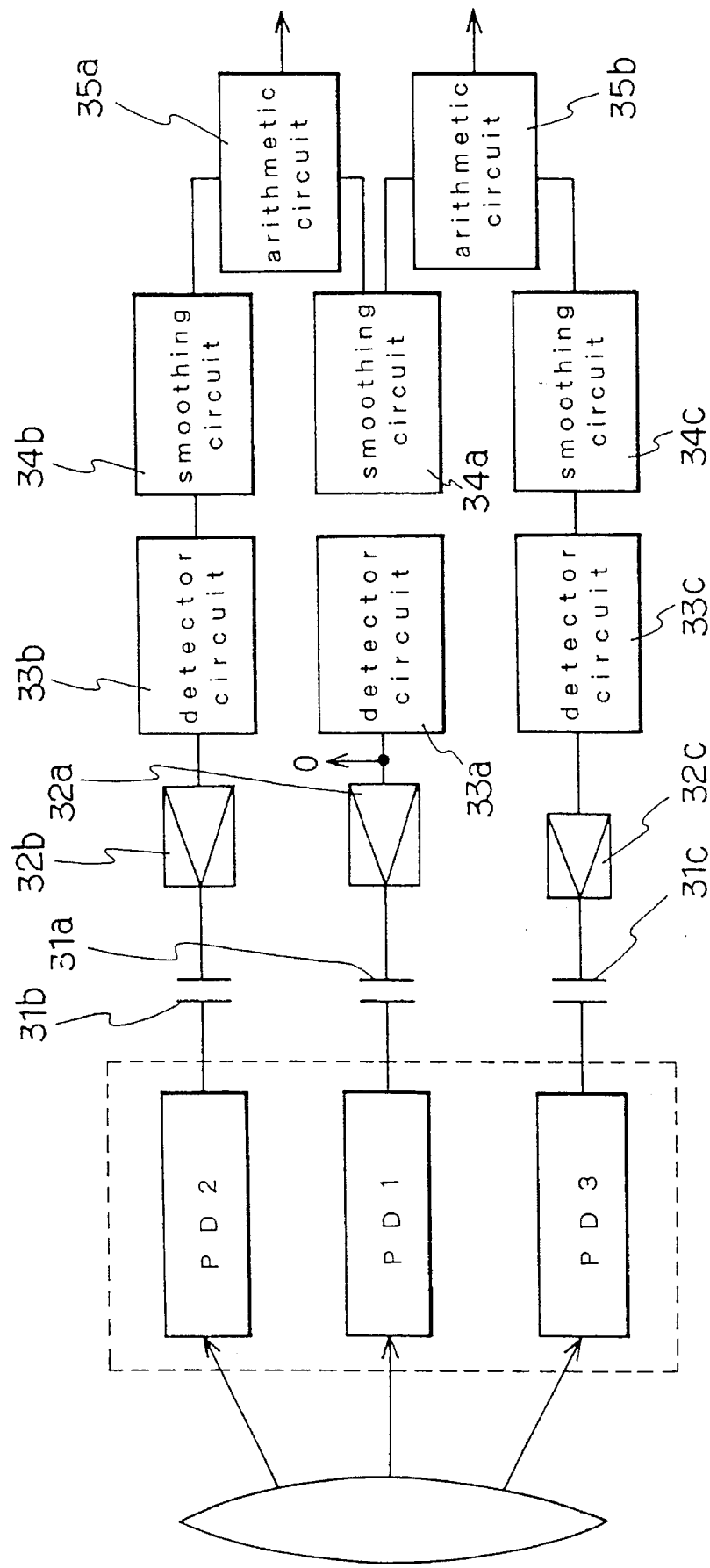
FIG. 5 is a block diagram of an example of a circuit for processing a signal detected by a PD.

The output of each PD, variation of the reflected light superposed on a steady output of each LD appears as repeated variations corresponding to repeating pits as shown in FIG. 4. Further, a variation in the output of each PD due to erroneous tracking or the like appears as a variation of about 2 to about 50 μA on a direct current of about 200 μA. Since the repeated variations appear substantially periodically corresponding to the repeating pits, only the alternating current component thereof is extracted, amplified and converted to a direct current, which is in turn compared with the counterpart one easily and precisely. An example of the circuit allowing such processing is shown in FIG. 5. The circuit in FIG. 5 comprises photodetectors PD1 to PD3 disposed as following the respective LDs, capacitors 31a, 31b and 31c for removing direct current component, amplifiers 32a, 32b and 32c, detector circuits 33a, 33b and 33c each formed of an operational amplifier or the like, smoothing circuits 34a, 34b and 34c, and arithmetic circuits 35a and 35b for finding a difference between two inputs to compare them with each other. In response to the output of each of the arithmetic circuits 35a and 35b, the servomotor associated therewith is controlled. An RF signal indicative of recorded information is drawn of an output terminal of the amplifier 32a connected to PD1. It is to be noted that although not shown, current-voltage conversion circuits each formed of a resistor or the like are provided before or after the respective capacitors I0a, 31b and 31c for converting the current of the associated PD to a voltage since the present embodiment is adapted for the L-SCOOP method.

Figure 6A:
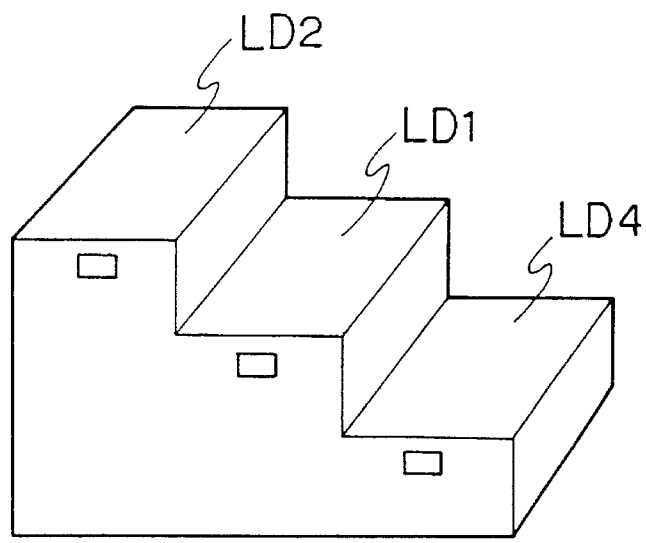
FIG. 6(a) through 6(c) illustrate the case where two LDs are provided independently of other LDs for detecting a tracking errors.
Figure 6B:
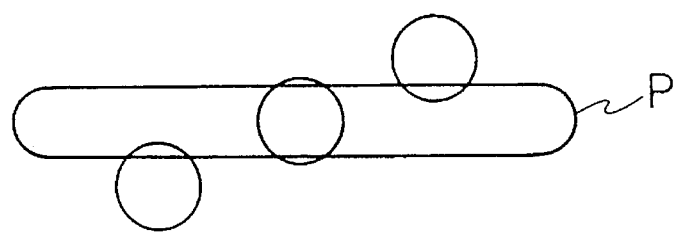
Figure 6C:
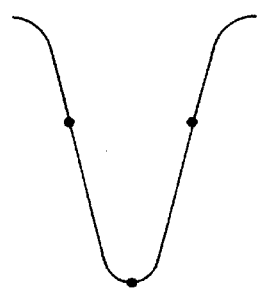
Figure 7:
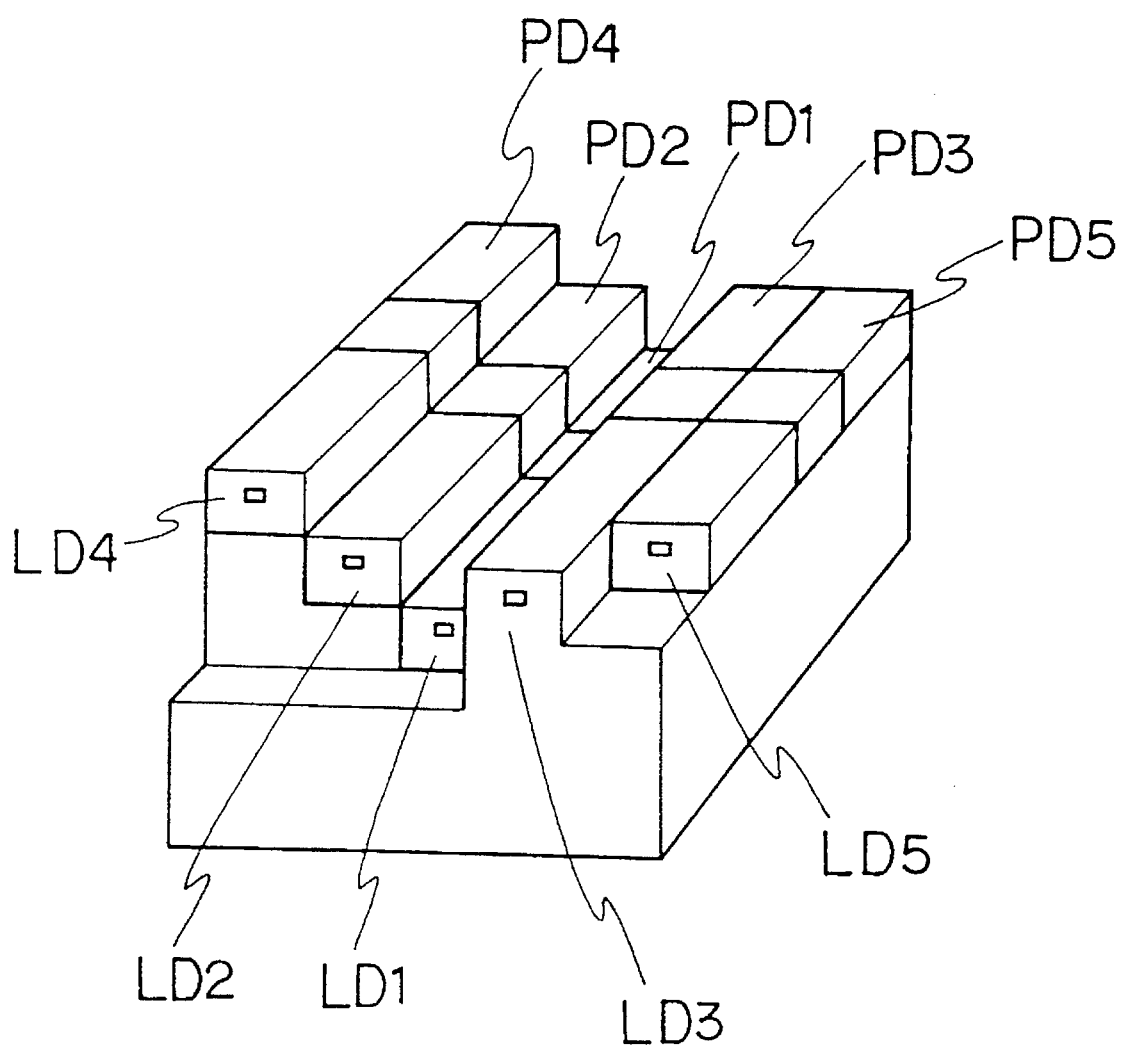
FIG. 7 is a schematic representation showing an example of the structure of a semiconductor chip on which five LDs are integrated.
Figure 8:
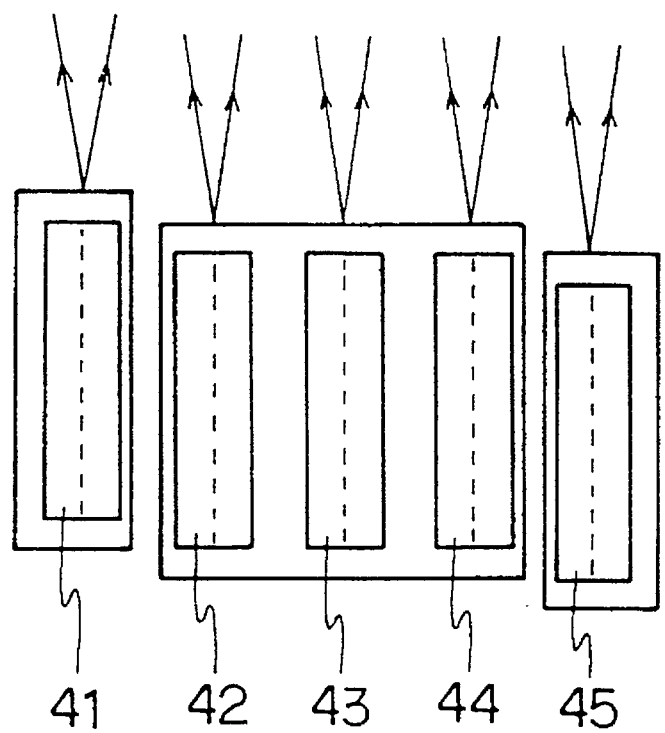
FIG. 8 is a schematic representation showing an example of a conventional arrangement of LDs which is adapted for the SCOOP method.
Figure 9:
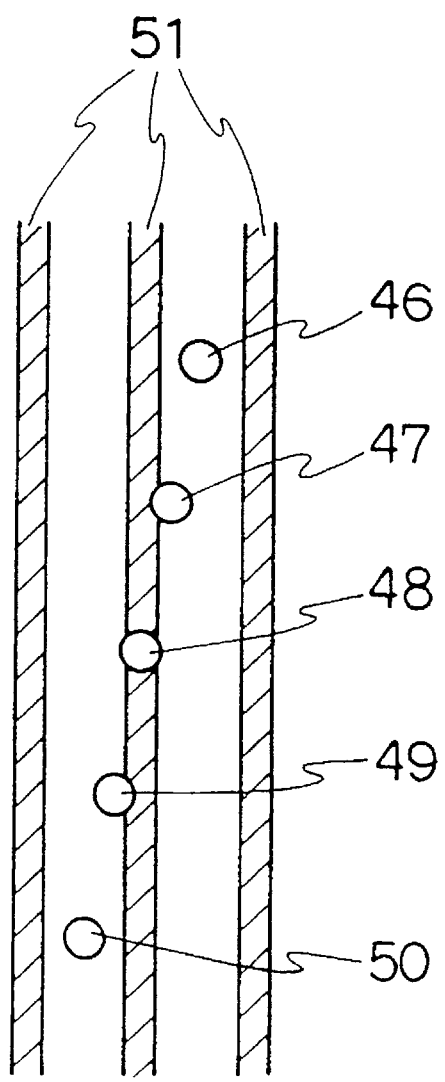
FIG. 9 illustrates the positional relationship between beam spots formed on an OD by the arrangement of LDs shown in FIG. 8.

Although the foregoing embodiment has three pairs of LDs and PDs where each PD detects an output signal of the corresponding LD, two LDs (LD2 and LD4) for precise tracking may be provided independently of LD1 for RF signal as shown in FIG. 6(a), and these two LDs may be controlled so that their respective beam spots would be formed on the opposite sides of a pit P as shown in FIG.6 (b) to equalize the corresponding two outputs as shown in FIG. 6(c). Similarly, two LDs for focusing error signal may be provided independently of LD1 and controlled so that their respective outputs would be equalized. These semiconductor laser systems can be constructed in a manner similar to that described for the foregoing embodiment having three LDs. That is, a step is formed on a semiconductor substrate to provide each LD for tracking error signal, while the light-emitting face of each LD for focusing error signal is defined by etching. FIG. 7 schematically shows an example of the structure having five LDs, wherein LD1 and PD1 are for detecting an RF signal indicative of recorded signal, LD2, LD4, PD2 and PD4 are for detecting a tracking error signal, and LD3, LD5, PD3 and PD5 are for detecting a focusing error signal. It should be understood that two $LD_s$ and respective $PD_s$ for either tracking error or focusing error may be provided independently, while the rest of the two kinds of signals is utilized by the cooperation of another LD with the LD1-PD1 pair. In this case, the number of LD parts is four in total.

In the foregoing embodiment, an LD is used for the light-emitting part. The LD is not limited in structure to that exemplified herein and may be of any structure as far as usable as an LD. Further, although a PD is used for the photodetection part, any other element capable of detecting light is usable therefor, such as a PD having a pn junction formed by ion implantation or a resistor layer, as well as the PD having a pn junction formed in the process of fabricating the associated LD. Still further, in the case of the E-SCOOP method adapted to read a variation in the voltage of an LD instead of detecting the quantity of light emitted by the LD, it is needles to say that the respective photodetection parts for tracking error signal and focusing error signal are unnecessary except for one for an APC operation.

The foregoing embodiment is of the structure having LDs and PDs for detecting an RF signal indicative of the state of a pit, tracking error signal and focusing error signal. Since the present invention allows these LDs and PDs to be formed in one chip, other LDs respectively dedicated for writing, erasing and verifying written information may be formed in the same chip along a track. Such an arrangement allows a reading operation immediately followed by writing new information or erasing, or a writing operation immediately followed by verifying the content thus written. Thus, the semiconductor laser system of such a structure will contribute to the realization of an efficient optical pickup.

Further, if an additional LD for a second RF signal is provided adjacent to the LD for the first RF signal by a distance equal to a track pitch (usually about 1.6 μm) in the direction perpendicular to the tracks, there can be detected respective signals from two tracks simultaneously.

Even such an additional LD can be integrated together with other LDs and PDs on one chip in accordance with the process of manufacturing the aforesaid semiconductor laser system. In this case, the additional LD for detecting a second RF signal is disposed as shifted both along the tracks and in the direction perpendicular to the tracks, like the LD for detecting a tracking error signal.

In accordance with the present invention, a small-size semiconductor laser system adapted for the SCOOP method is provided in which LDs respectively for detecting a signal recorded in a pit of an OD, for detecting a tracking error signal and for detecting a focusing error signal are integrated together on one chip. Hence, such a semiconductor laser system will assuredly contribute to the realization of a small-size optical pickup of high performance which is capable of accurately position beam spots if only the laser system is disposed at a predetermined distance from an objective lens without the need of a complicated alignment operation. In addition, the present invention makes it possible to reduce the cost of the semiconductor system itself and of assembling the same in an optical pickup and to dispense with expensive optical components, thereby contributing to a large reduction in the cost of the optical pickup.

Further, since the optical pickup using the semiconductor laser system of the present invention dispenses with a beam splitter, the efficiency in the utilization of light rises thereby increasing the speed of writing.

Still further, since the present invention monolithically integrates LDs together on a chip, there can be formed on the same chip additional LDs such as for writing only, for erasing only, for verification and for detecting a second signal. Thus, there can be achieved a high-grade function such as performing a series of operations —"read", "erase-"and "write"— at a time or reading signals out of two tracks at a time.

Though several embodiments of the present invention are described above, it is to be understood that the present invention is not limited only to the above-mentioned, various changes and modifications may be made in the invention without departing from the spirit and scope thereof.

What is claimed is:

1. A semiconductor laser system comprising:

at least first, second and third laser beam emitters formed on a surface of a substrate of one semiconductor chip, said second laser beam emitter having a light emitting face laterally offset from a light-emitting face of said first laser beam emitter, and said third laser beam emitter having a light-emitting face vertically offset from said light-emitting face of said second laser beam emitter;

wherein the laser beams therefrom are directed in a same direction but do not exist in a same plane, and wherein at least two of but not all of the laser beam emitters share one plane, perpendicular to the laser beams, for their light-emitting faces.

2. The semiconductor laser system of claim 1 further comprising photodetectors, waveguides and light-blocks;

wherein each of photodetectors are located on the opposite side of each of said emitters to said laser beam emitting surface being optically connected thereto through each of the waveguides, every pair of the waveguides next to each other are optically disconnected by each of the light-blocks.

3. A semiconductor laser system according to claim 1, wherein said at least three light-emitting parts are for detecting a tracking error signal, a focusing error signal and an RF signal indicative of information recorded in an optical disk, respectively, and furthering comprising a laser diode dedicated to writing information and/or a laser diode dedicated to erasing information, said light-emitting parts and said laser diode being formed on a same chip.

4. A semiconductor laser system according claim 1, wherein said at least three light-emitting parts are for detecting a tracking error signal, a focusing error signal and an RF signal indicative of information recorded in an optical disk, respectively, and furthering comprising a fourth light-emitting part for detecting another RF signal, said fourth light-emitting part being spaced apart by a distance equal to a width of a track formed in an optical disk from said at least three light-emitting parts for detecting an RF signal in a direction perpendicular to the track.

* * * * *

UNITED STATES PATENT AND TRADEMARK OFFICE
CERTIFICATE OF CORRECTION

PATENT NO. : 5,619,521
DATED : April 8, 1997
INVENTOR(S) : Tanaka

It is certified that error appears in the above-identified patent and that said Letters Patent is hereby corrected as shown below:

On the title page: Item [22]

please delete "December 11, 1995" insert therefor -- December 14, 1995 --

Signed and Sealed this

Twenty-eighth Day of April, 1998

Attest:

BRUCE LEHMAN

Attesting Officer

Commissioner of Patents and Trademarks